(12) United States Patent
Matsuo

(10) Patent No.: US 7,944,129 B2
(45) Date of Patent: May 17, 2011

(54) ULTRASONIC ACTUATOR AND MAGNETIC RECORDING APPARATUS USING THE SAME

(75) Inventor: Takeshi Matsuo, Itami (JP)

(73) Assignee: Konica Minolta Opto, Inc., Hachioji-shi (JP)

( * ) Notice: Subject to any disclaimer, the term of this patent is extended or adjusted under 35 U.S.C. 154(b) by 258 days.

(21) Appl. No.: 12/169,037

(22) Filed: Jul. 8, 2008

(65) Prior Publication Data

US 2009/0015098 A1 Jan. 15, 2009

(30) Foreign Application Priority Data

Jul. 13, 2007 (JP) .................. 2007-184175
Jul. 31, 2007 (JP) .................. 2007-198715
Jun. 6, 2008 (JP) .................. 2008-149175
Jun. 6, 2008 (JP) .................. 2008-149176

(51) Int. Cl.
*H01L 41/04* (2006.01)
*H02N 2/04* (2006.01)

(52) U.S. Cl. .................. 310/367; 310/323.01

(58) Field of Classification Search ............. 310/323.01–323.21, 328, 365–367
See application file for complete search history.

(56) References Cited

U.S. PATENT DOCUMENTS 4,814,660 A * 3/1989 Yamada et al. ............... 310/328
6,617,763 B2 * 9/2003 Mita et al. ..................... 310/328

FOREIGN PATENT DOCUMENTS

| JP | 8-322270 A | | 12/1996 |
|---|---|---|---|
| JP | 2000-152671 A | | 5/2000 |
| SU | 480875 | * | 10/1975 |
| SU | 819866 | * | 4/1981 |
| SU | 1254552 | * | 8/1986 |

* cited by examiner

*Primary Examiner* — Derek J Rosenau
(74) *Attorney, Agent, or Firm* — Sidley Austin LLP

(57) ABSTRACT

Provided are ultrasonic actuators and magnetic recording apparatuses that are stably equipped with superior driving performance without making the apparatus complex or raising cost. By providing an approximately equilateral triangular shaped vibrating member provided with piezoelectric deformation members that expand and contract upon the application of a driving signal, and a moving member that is in pressure contact with the three vertices of the vibrating member to cause relative movement with respect to the vibrating member. The moving member is caused to move relative to the vibrating member due to elliptical vibrations in the same rotational direction in basically the three vertices of the vibrating member due to a deformation vibration of the piezoelectric deformation parts.

9 Claims, 15 Drawing Sheets

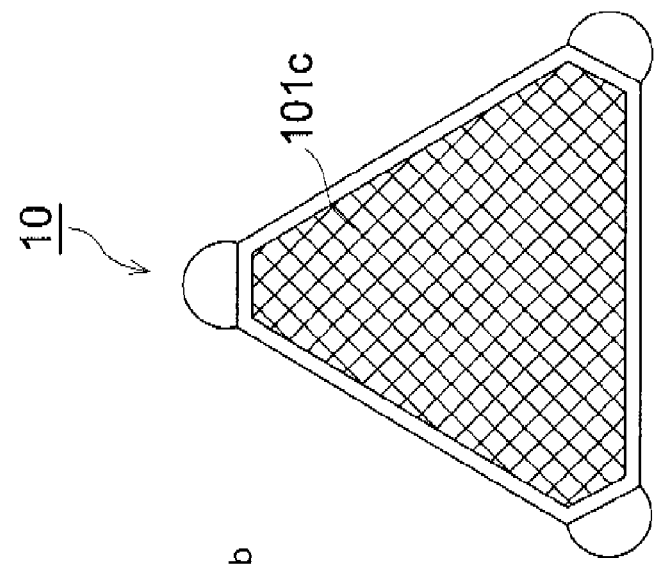
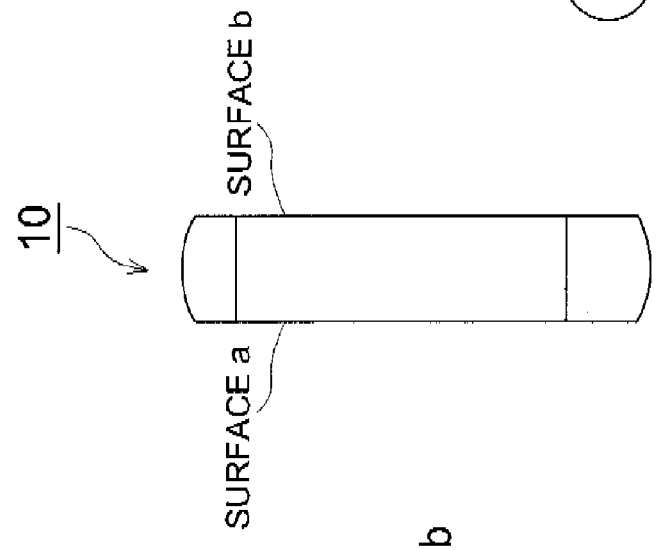
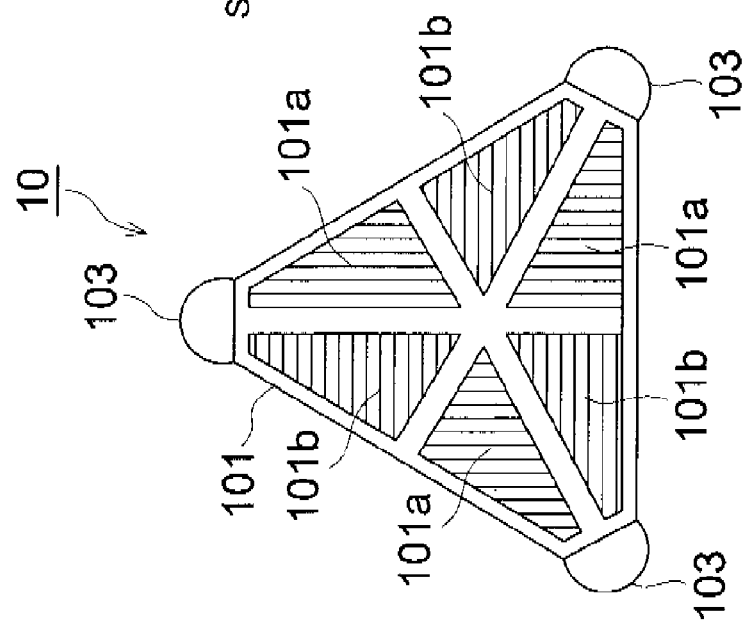

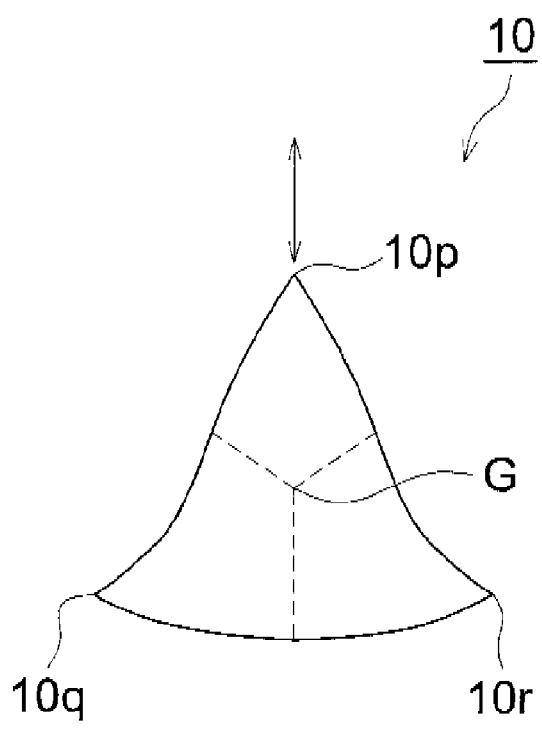
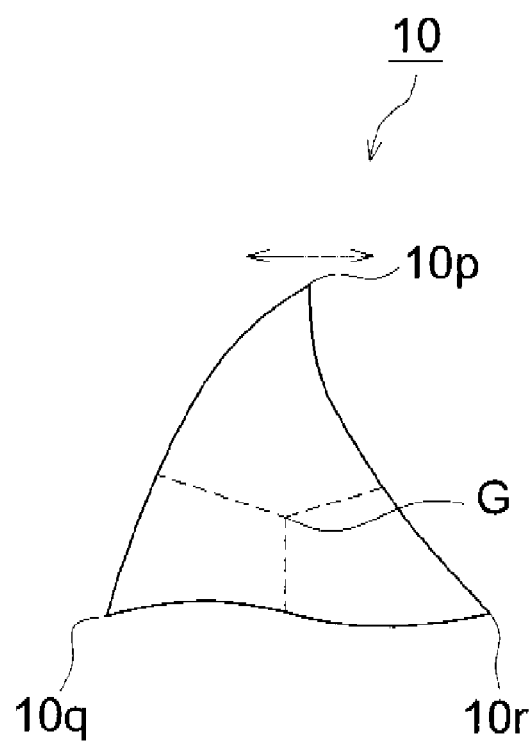
FIG. 4a
FIG. 4b

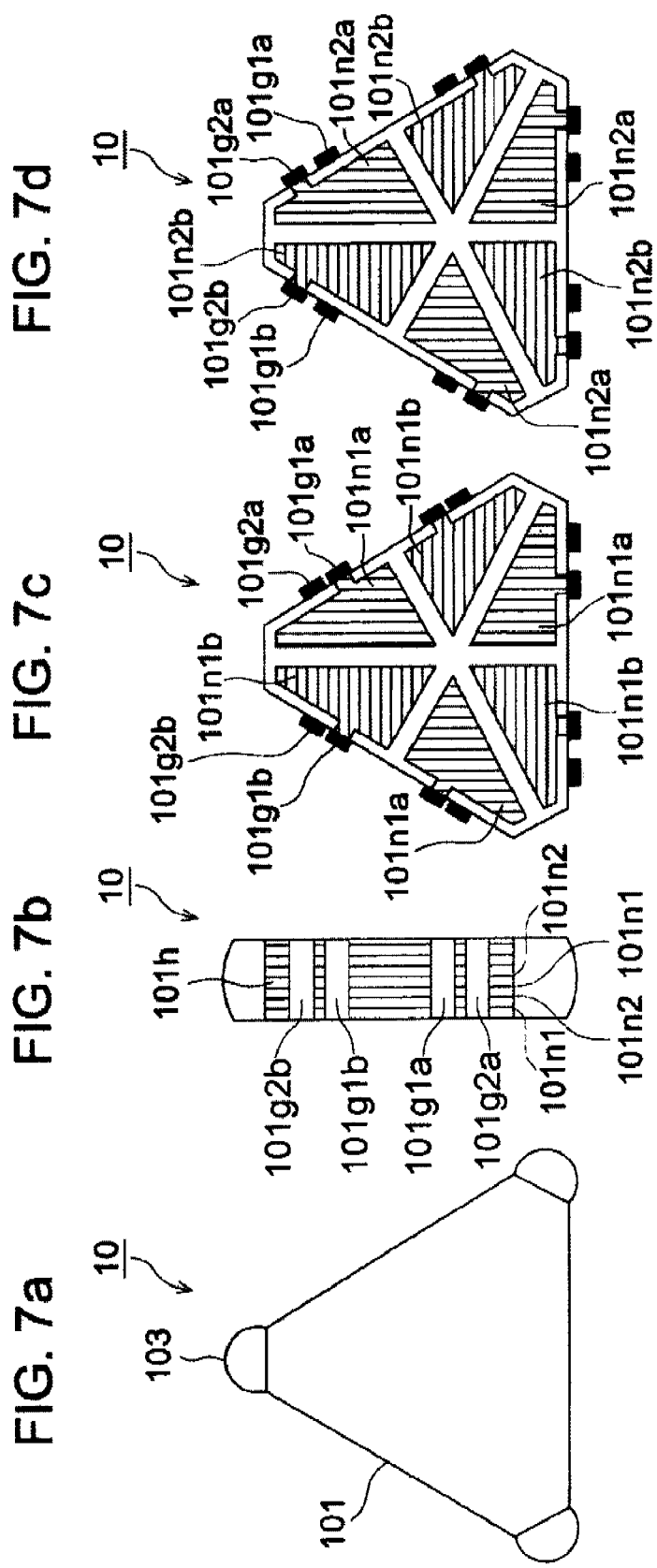

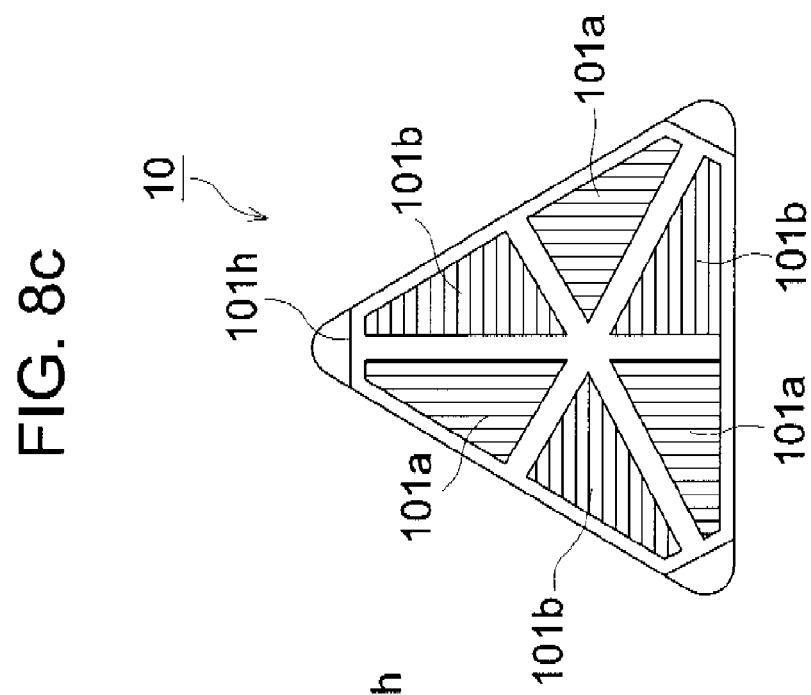
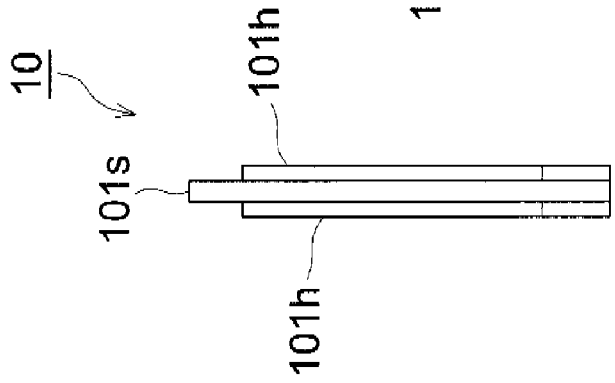
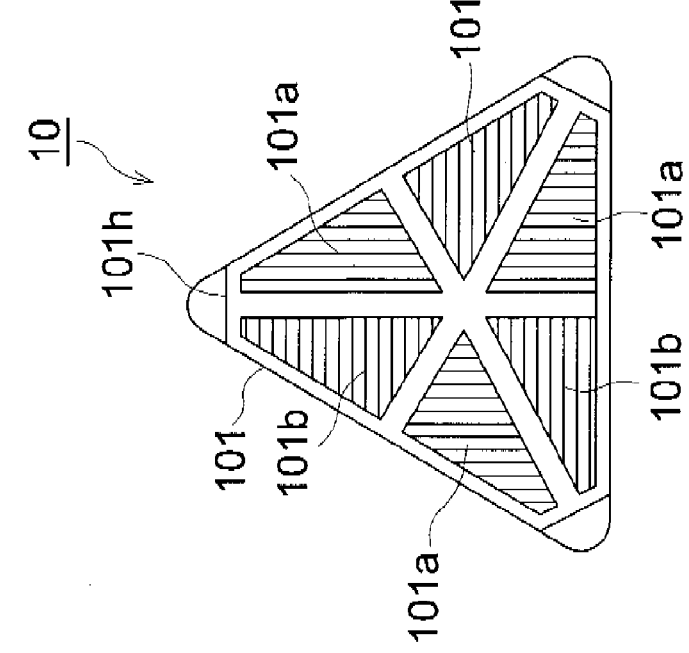

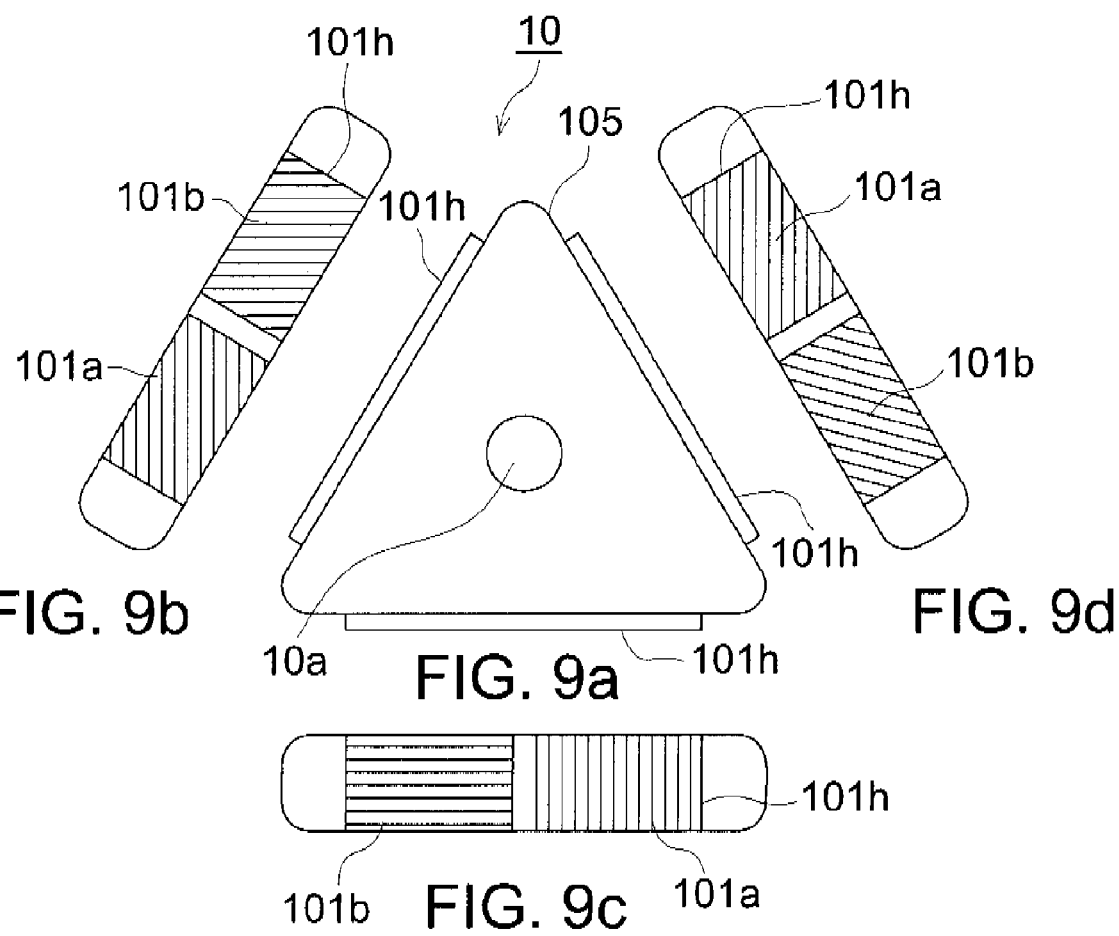

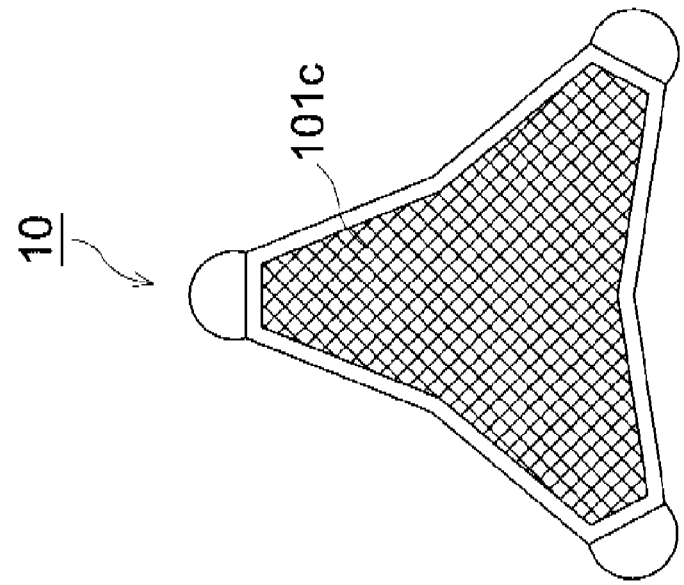
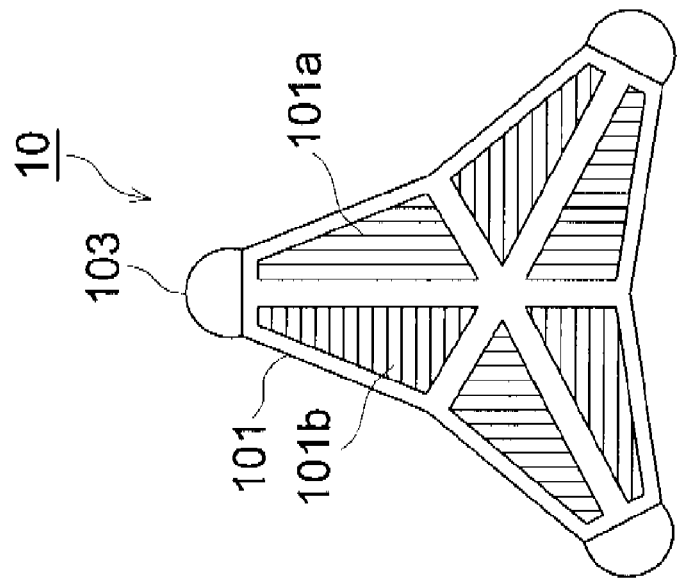

ULTRASONIC ACTUATOR AND MAGNETIC RECORDING APPARATUS USING THE SAME

This application is based on Japanese Patent Applications No. 2007-184175 filed on Jul. 13, 2007, No. 2007-198715 filed on Jul. 31, 2007, No. 2008-149175 filed on Jun. 6, 2008, and No. 2008-149176 filed on Jun. 6, 2008, in Japanese Patent Office, the entire content of which is hereby incorporated by reference.

TECHNICAL FIELD

The present invention relates to ultrasonic actuators and magnetic recording apparatuses, and in particular to ultrasonic actuators that include a vibrating member and a moving member which are pressure contacted to each other to generate relative movement, and magnetic recording apparatuses using the actuator.

BACKGROUND

Conventionally, use of ultrasonic actuators has been attempted in various mobile apparatuses. Ultrasonic actuators are usually configured using a vibrating member provided with a piezoelectric device which is an electromechanical energy conversion device, and a driven member (moving member) that contacts the vibrating member in a state in which it is pressed against the vibrating member. An ultrasonic actuator causes relative movement due to frictional force between the driven member which is pressure contacted with the vibrating member when an elliptical vibration (hereinafter includes a circular vibration) of a part of the vibrating member is caused by an expansion and contraction movement of the vibrating member upon input of a driving signal to the vibrating member.

Since an ultrasonic actuator has a small size and has excellent low noise characteristics, and since it is possible to carry out high speed and high accuracy position control, it has come to be used as the driving device in electronic equipment such as electronic cameras, etc., and its applications are still expanding.

On the other hand, in recent years, along with the progress in size reduction and higher performance of electronic equipment, there has been a demand for still higher performance in the drive capability of ultrasonic actuators used as the driving device of electronic equipment.

Thus, in order to meet such requirements, various investigations have been made to increase the driving efficiency of ultrasonic actuators.

For example, a rotational drive type ultrasonic actuator is known (see Japanese Unexamined Patent Application Publication No. H08-322270) which is provided with an equilateral triangle shaped piezoelectric vibrating element with an electrode divided into two pieces by the line connecting one of the vertices which serve as a point of contact with the moving member and the middle point of its opposite side, where elliptical vibration is excited at the vertex that becomes the point of contact, thereby frictional drive of the moving member is caused. Further, an ultrasonic motor is known (see Japanese Unexamined Patent Application Publication No. 2000-152671) in which a rotor is supported and driven rotationally using a plurality of ultrasonic vibrating elements.

The piezoelectric vibrating element disclosed in Japanese Unexamined Patent Application Publication No. H08-322270 is exciting elliptical vibration at its contact point contacted with the moving member by exciting and synthesizing vertical vibration and secondary bending vibration mode. However, in the drive method using such a vibration mode, the desired elliptical vibration is only excited at the contact point, and the other vertices vibrate following the desired elliptical vibration, and their elliptical locus and direction of rotation are different from the vertex contacted with the moving member, whereby there will be drive loss when the other vertices are contacted with the moving member. Therefore, when driving the internal peripheral surface of the rotor (the moving member), the vibrating member need to be contacted with the rotor at a single contact point, whereby the center of rotation does not get fixed with the single contact point, and a member that holds the rotor such as a bearing will be needed. Because of this, there were problems that the drive efficiency decreases due to the drive loss caused by the bearing load, as well as making the structure complex and increasing the cost.

Further, since the ultrasonic motor disclosed in Japanese Unexamined Patent Application Publication No. 2000-152671 requires a plurality of ultrasonic vibrating elements, there are problems that the structure becomes complex and the cost increases.

SUMMARY

The present invention was made in view of the above problems, and a purpose of the present invention is to provide an ultrasonic actuator and a magnetic recording apparatus that make it possible to obtain excellent drive performance in a stable manner without causing complexity of the apparatus or higher cost.

BRIEF DESCRIPTION OF THE DRAWINGS

FIGS. 3a, 3b, and 3c are drawings showing the structure of the vibrating member according to the first preferred embodiment;

FIGS. 4a and 4b are drawings showing the deformation in the single-point characteristic mode of the vibrating member according to the first preferred embodiment;

FIGS. 7a, 7b, 7c, and 7d are drawings showing the structure of the vibrating member according to a second preferred embodiment of the present invention;

FIGS. 8a, 8b, and 8c are drawings showing the structure of the vibrating member according to a third preferred embodiment of the present invention;

FIGS. 9a, 9b, 9c, and 9d are drawings showing the structure of the vibrating member according to a fourth preferred embodiment of the present invention;

FIGS. 10a, 10b, and 10c are drawings showing the structure of the vibrating member according to a fifth preferred embodiment of the present invention;

DETAILED DESCRIPTION OF THE PREFERRED EMBODIMENTS

Figure 1A:
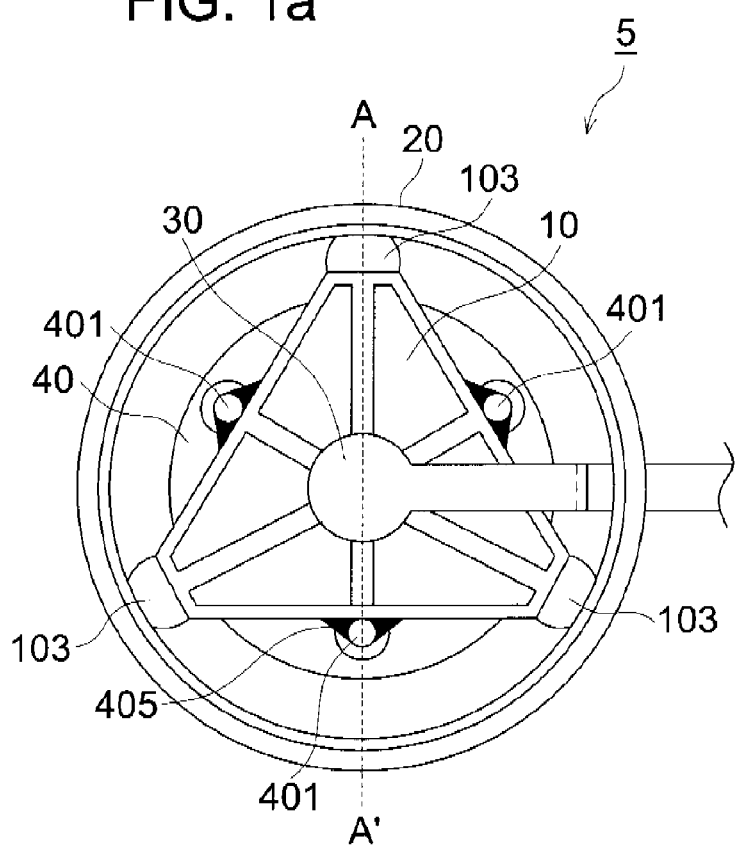
FIGS. 1a and 1b are the overall configuration diagrams of an ultrasonic actuator according to a first preferred embodiment of the present invention.

Some preferred embodiments of the ultrasonic actuators and magnetic recording apparatus according to the present invention are described below referring to the drawings. In addition, although the present invention is described based on the preferred embodiments shown in the figures, the present invention shall not be limited to these preferred embodiments. Further, identical symbols are assigned to the similar parts in the different preferred embodiments, and duplicate explanations have been omitted suitably.

First Preferred Embodiment

Figure 1B:
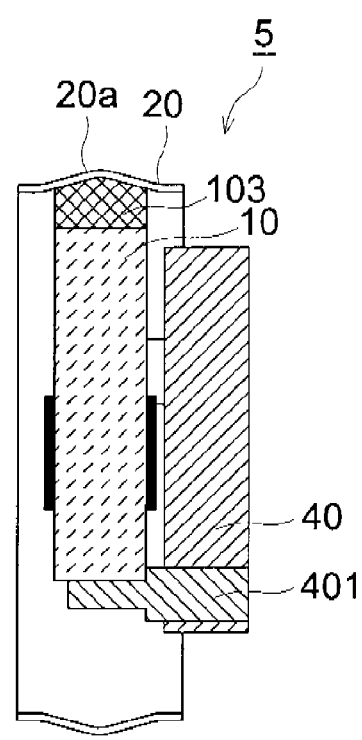

Firstly, the structure of an ultrasonic actuator 5 according to the first preferred embodiment is explained referring to FIGS. 1a and 1b. FIG. 1a is a front view showing the outline of the overall configuration of the ultrasonic actuator 5, and FIG. 1b is a cross-sectional diagram along a line A-A' in FIG. 1a.

As is shown in FIG. 1a, the ultrasonic actuator 5 has a vibrating member 10, a rotor 20, an FPC (Flexible Printed Circuit board) 30, and a fixing member 40, etc.

The vibrating member 10 has the shape of an equilateral triangle, and the hollow cylindrical shaped rotor 20 is contacting each of the vertices of the equilateral triangle from the outside. Before the rotor (moving member) 20 is assembled on the vibrating member 10, the dimension of the shape connecting the contact points has been set to be smaller than the dimensions of the vibrating member 10, and upon being assembled, the parts other than the contacting part get elastically deformed (in the assembled state, the rotor 20 is slightly triangular in shape), and a prescribed pressure force due to the rotor 20 acts on each contact point of the vibrating member 10.

As is shown in FIG. 1b, a V-shaped groove 20a has been formed in the circumferential inner surface of the rotor 20. Since three projection shaped chip members (as contact members of the present invention) 103 provided as described later on each of the vertices of the vibrating member 10 get engaged with the V-shaped groove 20a of the rotor 20, the swinging in the thrust direction is decreased, and the rotor 20 can carry out rotation with a high accuracy.

The vibrating member 10 is supported by three fixing pins (support members) 401 provided on the fixing member 40 and adhesive material 405 as described later in the neighborhood of the middle points of the sides where the vibration is relatively small. The supporting is done by pressure insertion or adhesion. Further, it is also possible to position the vibrating member with respect to the fixing member 40 by supporting, by the fixing pins 401, the notches provided in the neighborhood of the middle point of the sides of the vibrating member 10. In the application of the actuator according to the present preferred embodiment, the ultrasonic actuator 5 is positioned, for example, by fixing the fixing member 40 to the chassis or the frame of the magnetic recording apparatus to be described later.

Figure 2A:
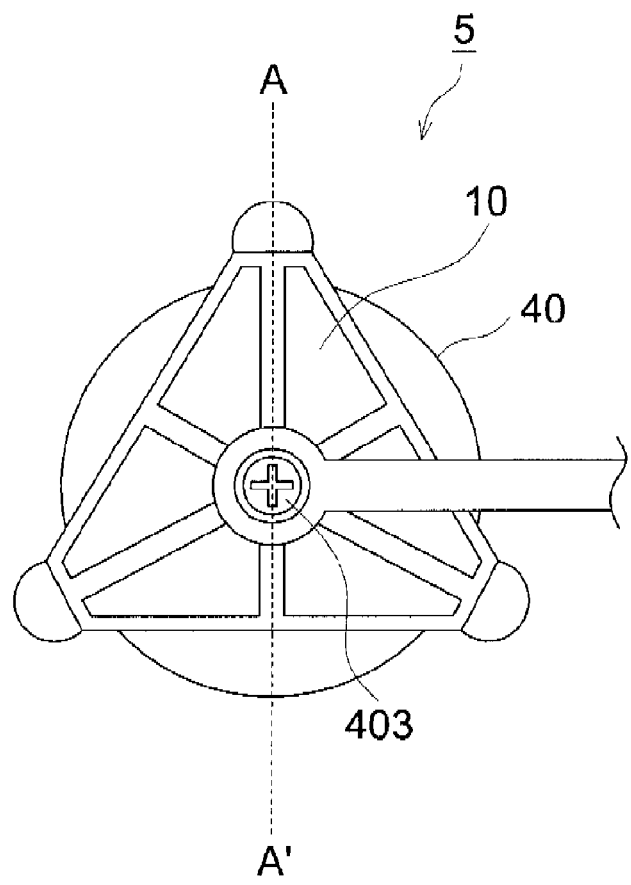
FIGS. 2a and 2b are diagrams showing a method of fixing a vibrating member according the first preferred embodiment.
Figure 2B:
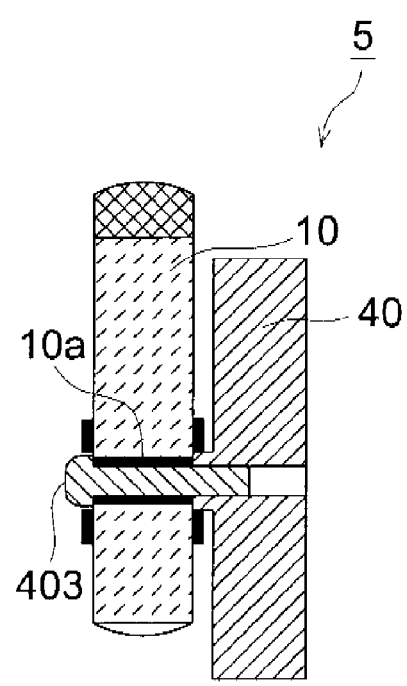

A method of fixing the vibrating member 10 in another method is shown in FIGS. 2a and 2b. FIG. 2a is the front view showing an outline of the vibrating member 10, and FIG. 2b is the cross-sectional diagram along the line A-A' in FIG. 2a.

As shown in FIG. 2b, it is also possible to provide a through hole 10a at the position of the center of gravity of the vibrating member body 10, and to fix it using a screw (support member) 403, etc. Since the position of the center of gravity is a node of vibration, the effect on the vibration caused by the fixing can be decreased to a minimum.

A material with a large elasticity is desirable for a material of the rotor 20, and metallic materials such as stainless steel are used. Further, in order to reduce wear, hardening treatment such as nitriding treatment is preferably made on the surface. In addition, it is also possible to carry out ceramic coating such as CrN or TiCN.

The FPC 30 is connected to the vibrating member 10, and a prescribed driving signal is inputted via the FPC 30 from a driving signal generator 7 of FIG. 12 or FIG. 14 to be described later.

When the driving signal is inputted to the vibrating member 10, elliptical vibrations that rotate in the same direction are generated in the three chip members 103, which are provided on the three vertices of the vibrating member 10, to be described later. Since the rotor 20 is contacted with the chip members 103 with a prescribed pressure, the rotor 20 rotates due to frictional force. In FIG. 1a, in the case in which each of the vertices cause elliptical vibration in a clockwise direction, the rotor 20 also rotates in the clockwise direction, and in the case in which each of the vertices causes elliptical vibration in an anticlockwise direction, the rotor 20 also rotates in the anticlockwise direction. Further, by varying the magnitude of the elliptical vibrations, it is possible to change the speed or the torque.

Since the rotor 20 is held by the three chip members 103 provided at the vertices of the vibrating member 10 with the shape of an equilateral triangle, the stability of orientation in the radial direction is extremely high, and also, since the swinging in the thrust direction is being controlled by the V-shaped groove 20a, it is possible to carry out rotation with an extremely high accuracy with very little fluctuation of the center. Further, since there is very little backlash, the rigidity is high, and it is possible to enhance the response of the motor. In addition, since there is no need for other members to hold the rotor 20 than the three vertices of the vibrating member 10, drive loss is suppressed, and it is possible to obtain a high driving efficiency.

Next, the structure of the vibrating member 10 is explained referring to FIGS. 3a, 3b, and 3c. FIG. 3a is a diagram of front view showing the structure of the vibrating member 10, FIG. 3b is a side view diagram, and FIG. 3c is the back view diagram.

As shown in FIG. 3a, the vibrating member 10 is made of three chip members (contacting members) 103 that are in contact with the rotor 20, and a piezoelectric member 101 with flat parts formed at the vertices of an equilateral triangle. The chip members 103 are bonded to the piezoelectric member 101 by adhesion. An epoxy type adhesive material with a high rigidity and with a high adhesive strength is used for this adhesion.

As the material of the chip members 103, a ceramic such as alumina or zirconia having a high hardness, or an ultra-hard alloy, etc., is used in order to reduce wear.

The piezoelectric member 101 is made of a piezoelectric material with piezoelectric characteristics such as PZT (lead zirconium titanate), etc, and driving electrodes 101a and 101b are provided on the "surface a" of the piezoelectric member 101, and a common thin film electrode (GND electrode) 101c is provided on the "surface b" of the piezoelectric member 101. The electrodes are constituted of silver or silver-palladium, and are formed by vacuum deposition. The driving electrodes, as shown in FIG. 3a, have the shape (six divisions) that is divided by the perpendicular line from each vertex of the vibrating member 10 to its opposite side, and for each vertex, a pair of an A-phase electrode 101a and a B-phase electrode 101b are provided, and all the A-phase electrodes are integrally connected and all the B-phase electrodes are integrally connected via the FPC 30. Therefore, the piezoelectric member 101 is constituted to have three piezoelectric deformation portions, such as driving regions, each with the same shape with a pair of the A-phase electrode and the B-phase electrode provided thereon corresponding to each vertex. It is possible to suppress the effect of the FPC 30 on the vibrations by connecting it near the position of the center of gravity of the triangle which is a node of the vibration as described later. Further, solder or a conductive adhesive, etc., is used for the connection.

Next, the method of driving the ultrasonic actuator 5 of this type of structure will be explained below. The basis of the driving method is elliptical vibration driving using resonance for rotating the rotor 20. Resonance is used in this method of driving by exciting elliptical vibration in each of the vertices of the vibrating member 10, and it is possible to enlarge the amplitude by several tens of times, and it is possible to obtain a large elliptical vibration efficiently using even a low voltage. The principle of its operation and the driving characteristics are explained in the following.

Figure 11A:
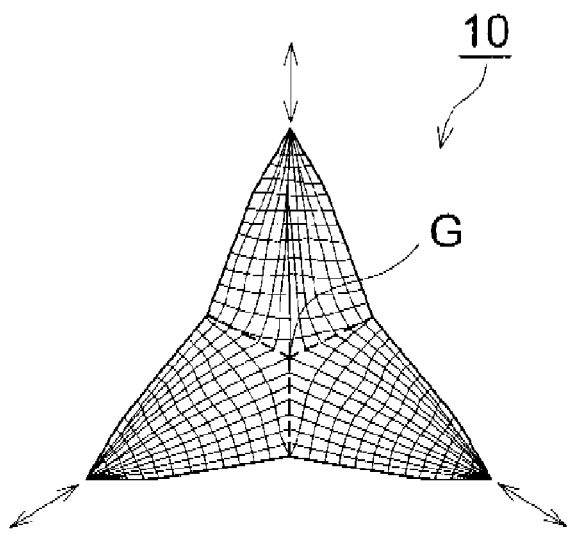
FIGS. 11a and 11b are diagrams showing the deformation in the three-point characteristic mode of the vibrating member according to the first preferred embodiment.
Figure 11B:
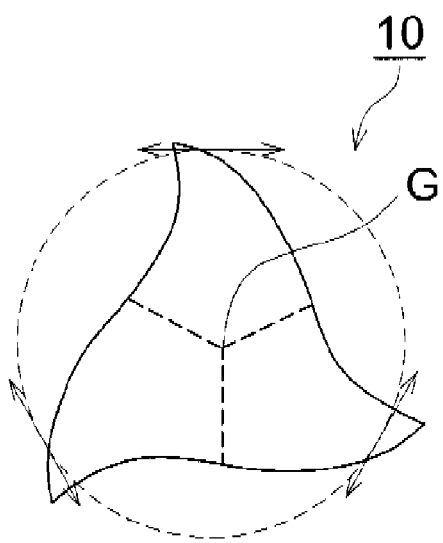

Three-Point Characteristic Mode:

To begin with, the three-pint characteristic mode which is the first driving method of the first preferred embodiment is explained here referring to FIG. 11a and FIG. 11b. In the three-point characteristic mode, in order to excite an elliptical vibration with the same rotation direction in each of the vertices of the vibrating member 10, in the present preferred embodiment, the two vibration modes shown in FIG. 11a and 11b are used. FIG. 11a is a schematic diagram showing the deformations of the vibrating member 10 in the three-point expansion and contraction vibration mode, and FIG. 11b is that in the three-point bending vibration mode.

In the three-point expansion and contraction vibration mode, the position of the center G of gravity of the vibrating member 10 is a node of vibration, and the three regions divided to each include one the three vertices carry out expansion and contraction vibration, and each of the vertices causes reciprocating movement radially in phase. In the three-point bending vibration mode, the position of the center G of gravity of the vibrating member 10 is a node of vibration, and the three regions divided to each include one of the three vertices carry out bending vibrations, and each of the vertices causes reciprocating movement in phase in the tangential direction of the circumference of the circumscribed circle, whose center is the point G of gravity, of the vibrating member 10. Each mode can be excited by inputting driving signals of the same frequency corresponding to each resonance frequency to the A-phase electrodes 101a and B-phase electrodes 101b, in the same phase for the three-point expansion and contraction vibration mode or in the opposite phases for the three-point bending vibration mode. In both the three-point expansion and contraction vibration mode and the three-point bending vibration mode, the position G of the center of gravity of the vibrating member 10 is the node of vibration, and also since the middle point of each of the three sides is vibrated relatively small, it causes little effect on the elliptical vibration to fix the vibrating member 10 at those points.

Method of Adjusting the Resonance Frequencies:

In the three-point characteristic mode, the resonance frequencies of the three-point expansion and contraction vibration mode and the three-point bending vibration mode can be set so as to have a prescribed relationship depending on the mass of the chip members 103 or the diameter of the hole provided at the center of gravity of the vibrating member 10. Further, it is also possible to adjust the difference between the resonance frequencies, at the time of manufacturing, of the two vibration modes by post processing.

Figure 12:
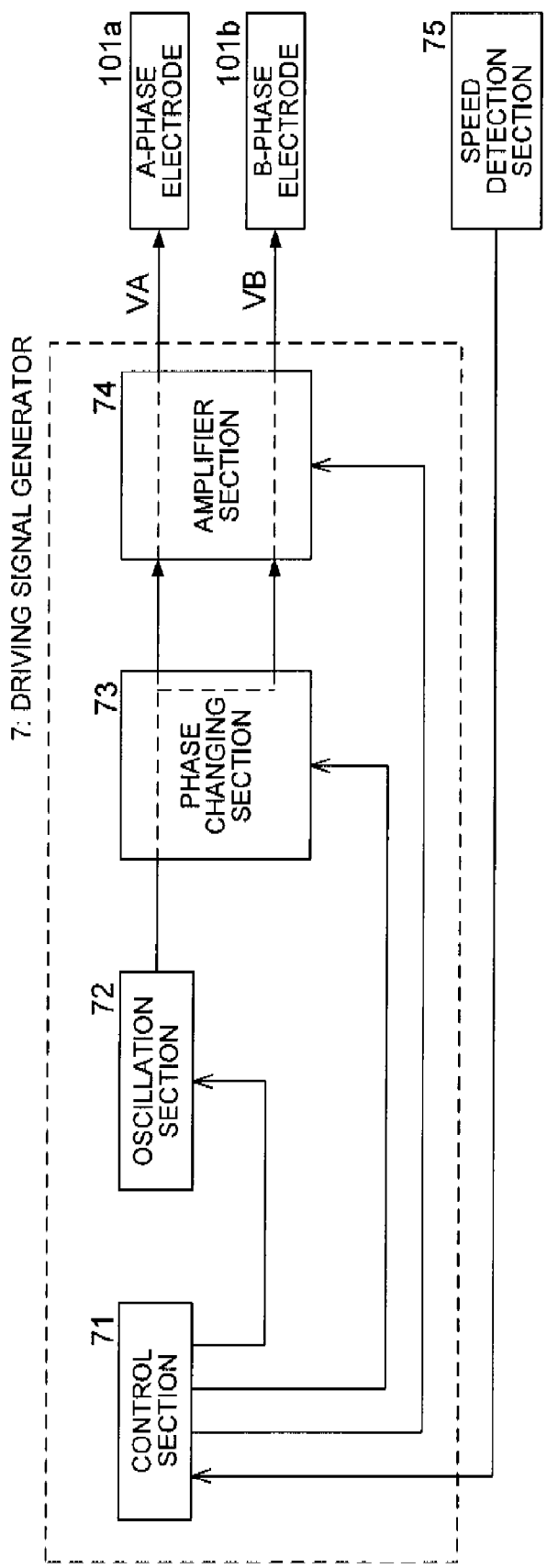
FIG. 12 is a block diagram showing a driving signal generator of a first example of the driving method of the three-point characteristic mode.
Figure 13:
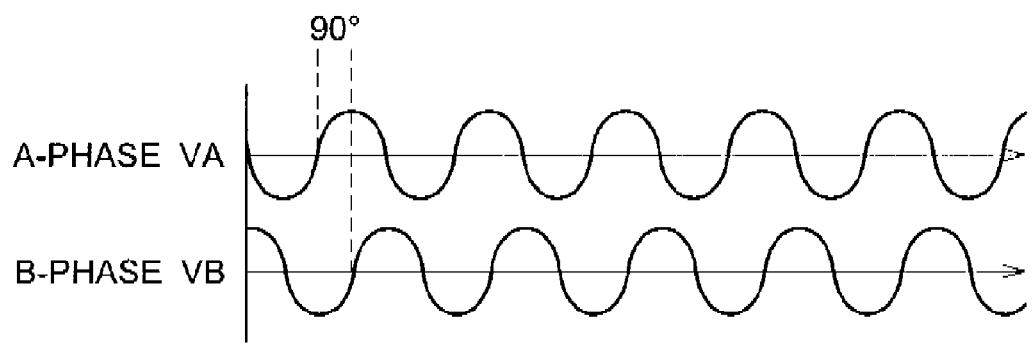
FIG. 13 is a diagram showing driving signals of the first example of the driving method of the three-point characteristic mode.

Phase Difference Driving Method:

The phase difference driving method is described using FIG. 12 and FIG. 13 as a first example of the driving method of the three-point characteristic mode which is a first driving method of the first preferred embodiment. FIG. 12 is a block diagram showing one example of the driving signal generator 7, and FIG. 13 is a diagram showing an example of the driving signals VA and VB.

To begin with, the configuration of the driving signal generator 7 is explained referring to FIG. 12. The driving signal generator 7 has a control section 71, an oscillation section 72, a phase changing section 73, and an amplifier section 74 as shown in FIG. 12. The oscillation section 72 is an oscillator that generates a signal with a prescribed frequency and which is a base of the driving signals VA and VB. The phase changing section 73 adjusts the phase of the signal from the oscillation section 72, and generates two signals with different phases. The amplifier section 74 amplifies the signals generated by the phase changing section 73 to generate the AC driving signals VA and VB, and applies them to the A-phase electrodes 101a and the B-phase electrodes 101b of the vibrating member 10 respectively. The control section 71 detects the drive conditions of the rotor 20 based on the output of the speed detection section 75 provided in the ultrasonic actuator 5 for detecting the rotational speed of the rotor 20, and controls the oscillation section 72, the phase changing section 73, and the amplifier section 74, and also controls the drive characteristics (speed, torque, etc.,) by adjusting the frequency of and the phase difference between the driving signals VA and VB. In the present preferred embodiment, although alternating voltages are being used as the driving signals, these signals are necessarily alternating voltages, but they can also be pulsating voltages including AC components.

By making the two resonant frequencies of the two vibration modes described earlier to be almost equal to each other, and by providing the driving signals VA and VB of a frequency equal to the resonant frequency and with phase difference, for example, of 90° as shown in FIG. 13 to the A-phase electrodes 101a and the B-phase electrodes 101b, the two vibration modes are simultaneously excited and synthesized, and elliptical vibrations in phase and with the same direction of rotation are generated at the vertices of the vibrating member 10. When the relationship of the phase difference of the two driving signals VA and VB is reversed, the direction of rotation of the elliptical vibrations gets reversed. Further, by changing the amplitude and the phase difference between the driving signals VA and VB, it is possible to change the magnitude or the vertical to horizontal ratio of the locus of the elliptical vibrations.

Figure 5A:
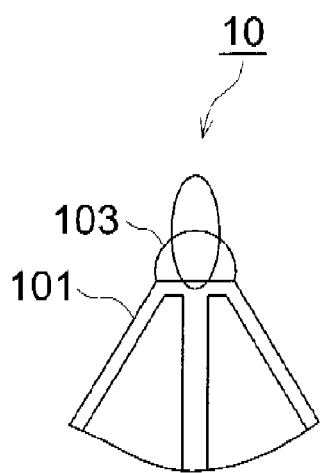
FIGS. 5a, 5b, and 5c are schematic diagrams showing the change in the elliptical locus with respect to the phase difference of the driving signals.
Figure 5B:
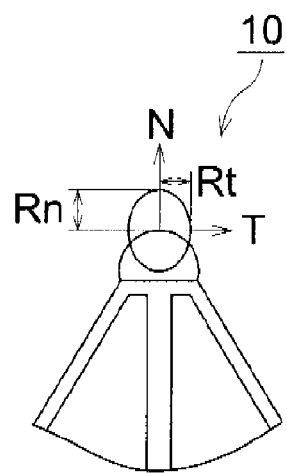
Figure 5C:
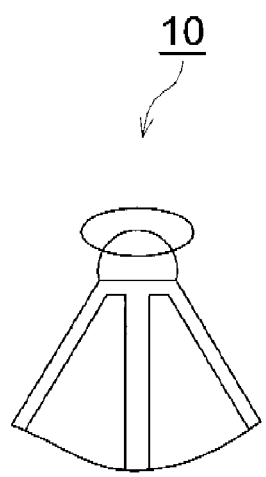

The magnitude of the elliptical vibrations changes in proportion to the amplitude (voltage) of the driving signals. Further, by changing the phase difference between the driving signals VA and VB, it is possible to change the vertical to horizontal ratio of the locus of the elliptical vibrations. FIGS. 5a, 5b, and 5c are schematic diagrams showing the changes in the elliptical locus with respect to the phase difference between the driving signals VA and VB. FIG. 5a shows the case in which the phase difference between the driving signals VA and VB is 45°, FIG. 5b is the case when the phase difference is 90°, and FIG. 5c is the case when the phase difference is 135°. As the phase difference becomes smaller, the diameter of the ellipse along the normal line N to the inner surface of the rotor 20 becomes larger, and as the phase difference becomes larger, the diameter of the ellipse along the tangential line T becomes larger. Since it is possible to change the drive characteristics by changing the shape of the elliptical locus as described later, it is possible to apply this to speed control or position control. Further, by carrying out phase difference drive by driving using driving signals VA and VB with a phase difference, it is possible not only to drive with a low voltage but also to carry out drive control by the phase difference.

Single Phase Driving Method:

As a second example of the driving method using the three-point characteristic mode, the single phase driving method is explained below. The shape of the vibrating member is configured so that the resonance frequency of the three-point expansion and contraction vibration mode and the resonance frequency of the three-point bending vibration mode are set to be different from each other by a prescribed amount, and a single phase driving signal with a frequency in between those two frequencies is applied to either of A-phase electrodes 101a or B-phase electrodes 101b. By doing this, elliptical vibrations with the same phase and with the same direction of rotation are excited at each of the vertices of the vibrating member 10. By switching the set of electrodes to which the driving signal is inputted, it is possible to reverse the direction of rotation of the elliptical vibrations. By shifting the resonant frequencies of the two vibration modes by a prescribed amount, the two modes are simultaneously excited and synthesized by the vibration force generated by the driving voltage applied to one of the electrode pair, thereby generating elliptical vibrations. Since it is possible to drive using a single phase driving signal, the drive circuit becomes simple, and it is possible to reduce the cost.

Single-Point Characteristic Mode:

Next, as a second driving method of the first preferred embodiment, a driving method using the single-point characteristic mode is described below. The single-point characteristic mode is a vibration mode that can be generated by driving the vibrating member with a frequency other than the resonance frequencies in the three-point characteristic modes, and even in this case, the vibrating member causes resonant vibrations. In this mode, it is possible to drive selectively one or two of the vertices of the vibrating member, or to drive the three vertices in phases different from each other.

Also in the single-point characteristic mode, there are the expansion and contraction vibration mode and the bending vibration mode similar to the three-point characteristic mode, and these are called the single-point expansion and contraction vibration mode and the single-point bending vibration mode, respectively. The vibration of the vibrating member in the single-point expansion and contraction vibration mode is shown in FIG. 4a, and one in the single-point bending vibration mode is shown in FIG. 4b. In order to simplify the explanations, in FIG. 4a and FIG. 4b, the cases are shown in which only the driving region including the vertex point 10p is being driven.

In the single-point expansion and contraction vibration mode, an expansion and contraction vibration is made in the vibrating member 10 in the up-down direction on the Figure, and the vertex 10p made a reciprocating vibration in the direction of the line connecting the vertex 10p to the position of the center G of gravity. In the single-point bending vibration mode, the bending vibration is made in the neighborhood of the vertex 10p, and the vertex 10p causes a reciprocating vibration in a direction perpendicular to the direction of the reciprocating vibration in the single-point expansion and contraction vibration mode.

Further, in the case of the single-point characteristic mode, it has been confirmed by simulations that the resonance frequency of the single-point expansion and contraction vibration mode and the resonance frequency of the single-point bending vibration mode are always the same dependently of the mass or the magnitude of the chip member 103, the hole diameter at the position of the center of gravity and the state of fixing of the vibrating member 10. Because of this, the degree of freedom is high in designing the chip member 103 and the method of fixing it to the vibrating member 10, and since there is no reduction in the performance caused by the difference of the resonance frequencies, generated when manufactured, of the characteristic modes, the variations in the performance of the vibrating member is small, and it is possible to manufacture with extremely high stability.

Figure 14:
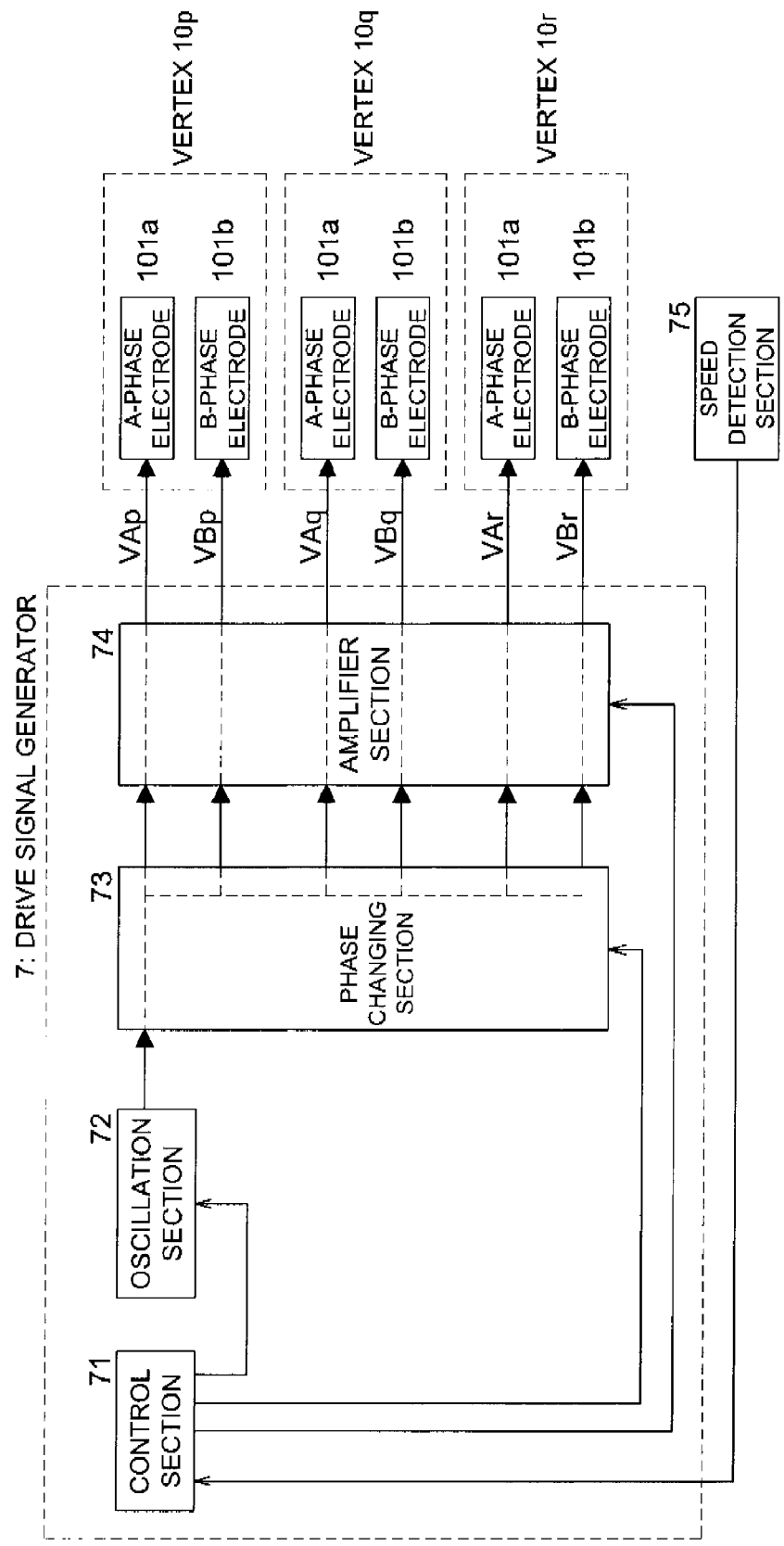
FIG. 14 is a block diagram showing a driving signal generator of the driving method of the single-point characteristic mode.
Figure 15:
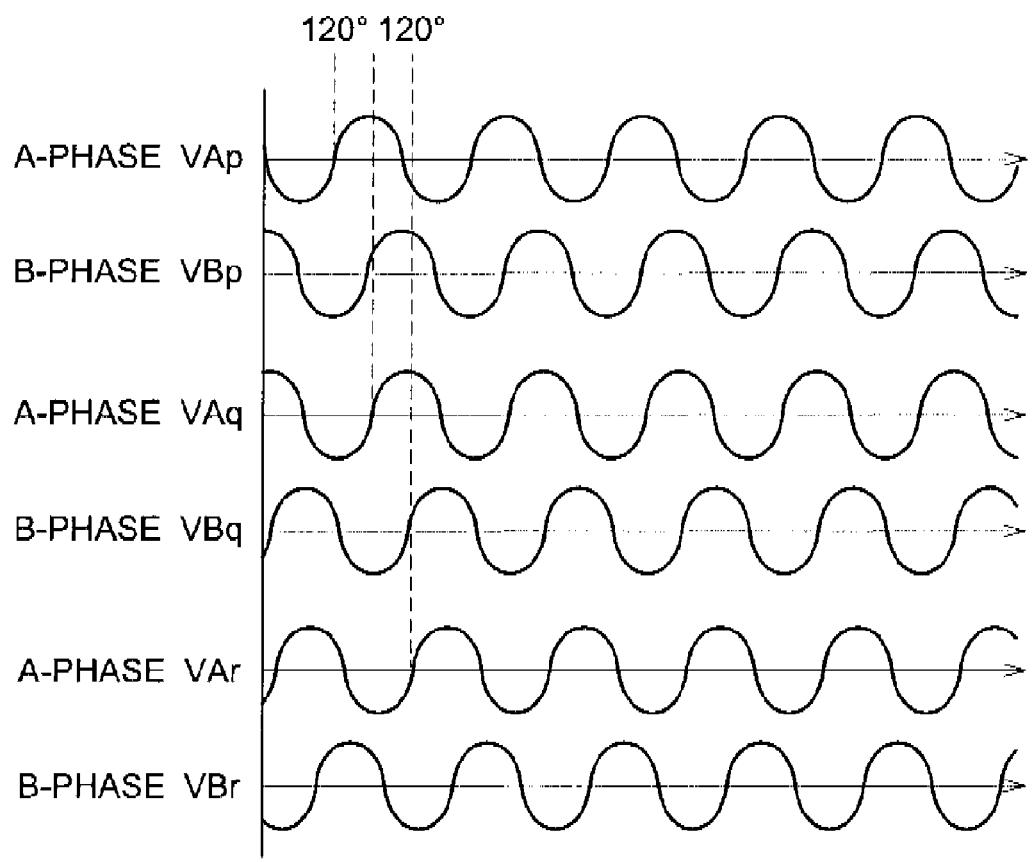
FIG. 15 is a diagram showing driving signals of the drive method of the single-point characteristic mode.

The driving method using the single-point characteristic mode is explained more concretely here referring to FIG. 14 and FIG. 15. FIG. 14 is a block diagram showing a driving signal generator 7, and FIG. 15 is a diagram showing driving signals.

The driving signal generator 7 according the present preferred embodiment, as shown in FIG. 14, differs from the driving signal generator 7 described earlier and shown in FIG. 12 in the phase changing section 73 and the amplifier section 74, while the other components of its configuration are the same. The phase changing section 73 according to the present preferred embodiment adjusts the phases of the signals from the oscillation section 72, and generates three pairs of signals, where the phases between these pairs are different and two signals in one pair have different phases each other. The amplifier section 74 amplifies the three pairs of signals generated in the phase changing section 73 and generates three pairs of AC driving signals VAp, VBp, VAq, VBq, VAr, and VBr, and applies each of them to the A-phase electrodes 101a and the B-phase electrodes 101b corresponding to the different vertices 10p, 10q, and 10r of the vibrating member 10. In the present preferred embodiment, although AC voltages are used as the driving signals, it is not necessary for them to be AC voltages, but they can also be pulsating voltages including AC components.

In this case, each of the different A-phase electrodes 101a and the different B-phase electrodes 101b of the different vertices of the vibrating member 10 are not integrally connected, but the configuration is such that the FPC 30 can supply an independent drive voltage to each of these electrodes.

As shown in FIG. 15, by applying three pairs, with phase difference of 120° between them, of the voltages VAp, VBp, VAq, VBq, VAr, and VBr to the electrodes corresponding to the different vertices 10p, 10q, and 10r of the vibrating member 10, each of the vertices causes an elliptical vibration with a phase difference of 120° between them.

In the driving method using the three-point characteristic modes described earlier, since the phase difference between the three vertices is 0°, the chip members 103 repeat contact and separation with the rotor 20 due to the elliptical vibration in the same phase, in other words, the contact and separation are simultaneously carried out for all three vertices. Therefore, the rotor 20 runs freely with a small deceleration while the chip members 103 is apart from the rotor 20, and gets accelerated while the chip members 103 are in contact with the rotor again, thereby repeating slight acceleration and deceleration. However, in the driving method using the single-point characteristic mode, since the phases of the elliptical vibrations of the chip members 103 of the three vertices are different from each other, the timings of contact and separation are different for the three vertices, and any one of the chip member 103 is always in contact with the rotor 20 with the driving force being applied without a break. Therefore, the acceleration and deceleration of the rotor 20 are still smaller, and the stability of the drive increases.

Further, the method of driving the three vertices in different phases has been explained above. However, also in the single-point characteristic mode, it is possible to drive all the three vertices in the same phase.

While the explanations of the driving method using the single-point characteristic mode will be concluded, apart from the above method, as another method of driving using the single-point characteristic mode, it is possible, for example, to apply the driving signals VAp and VBp only to the A-phase electrode 101*a* and the B-phase electrode 101*b* of the vertex 10*p*. According to this method, it is possible to drive with a low speed and low power consumption.

Elliptical Locus and Drive Characteristics:

Here, the relationship between the elliptical locus drawn by the chip members 103 due to the drive methods described above and the drive characteristics is explained referring to FIGS. 5*a*, 5*b*, and 5*c* described above. When the elliptical vibrations generated in the chip members 103 are separated into the component along the tangential direction T of the rotor 20 and the component along the normal direction N to the inner surface of the rotor 20, since the rotational speed of the rotor 20 is determined by the speed along the tangential direction T of the elliptical vibrations of the chip members 103, the speed is determined by the diameter Rt of the elliptical locus along the direction T and by the drive frequency, and the speed becomes larger as Rt becomes larger.

On the other hand, regarding the driving force, it basically depends on the product of the pressure force and the friction coefficient, however, the diameter Rn along the normal direction N of the elliptical locus also affects it. This is because, if the pressure force is small with respect to the diameter Rn along the pressure direction of the elliptical locus, the chip members 103 cause the elliptical motion while repeating contact and separation with the rotor 20, and drive the rotor 20 by friction force only when they are in contact. Therefore, in this condition, a greater driving force is obtained by increasing the pressure force. However, if the diameter Rt is increased and the diameter Rn is decreased in order to increase the driving speed, the pressure force becomes relatively too large with respect to the diameter Rn, and the elliptical vibrations are made in the condition in which the contact is being made at all times without a break due to the elastic deformation of the rotor 20 or the contacting surface, or due to the elastic deformation of the structural members receiving the pressure force.

In this condition, frictional force acts even when the chip members 103 are moving in the direction opposite to the driving direction during the cycle of vibration, and this becomes a break for the movement along the desired direction of movement. Therefore, in this condition, even if the pressure force is increased, a driving force greater than the force determined by Rn is not obtained. Further, in the drive in such a condition, speed fluctuations and repeatability and other drive conditions become unstable, and also, some abnormalities can occur such as the generation of abnormal sounds. Therefore, the driving force becomes larger since the larger diameter Rn of the elliptical locus along the pressure direction makes a larger pressure force be available, and stable drive becomes possible.

Therefore, the elliptical locus shown in FIG. 5*a* realizes the low speed and high torque characteristics, and the elliptical locus shown in FIG. 5*c* realizes the high speed and low torque characteristics, and by changing the phase difference between the driving signals VA and VB, it is possible to control the drive performance, and it becomes possible to carry out a drive such as constant speed control or positioning control with high accuracy, etc.

DC Drive:

Next, explanations are given about the DC drive. The DC drive is the method of causing minute swinging movement of the rotor 20, is used when extremely high accuracy positioning is demanded, and it is possible to obtain positioning resolution of nanometer order. After carrying out rough movement (high speed, wide rotation angle drive) by resonant drive as explained earlier, by carrying out fine movement using DC drive, it is possible to realize a drive system capable of wide range, high speed drive, and high accuracy positioning.

As the driving method, by applying only a DC voltage to the A-phase electrodes 101*a*, the three driving regions that include the different vertices of the vibrating member 10 bend in the tangential direction of the circumscribed circle that passes through the different vertices as shown in FIG. 4*b*, and the tips of the chip members 103 fall in the tangential direction of the circumscribed circle. The rotor 20 in frictional contact with the chip members 103 moves (rotates) by the same amount as the movement of the chip members 103 due to frictional force, and return to the original state when the application of the voltage is removed. Similarly, upon applying a DC voltage to only the B-phase electrodes 101*b*, the rotor 20 moves slightly in the opposite direction. Further, when a DC voltage is being applied to the A-phase electrodes 101*a*, by applying a voltage of the opposite polarity to the B-phase electrodes 101*b*, the amount of bending of the vibrating member 10 becomes larger, and a larger amount of rotation of the rotor 20 can be realized.

Next, a preferred embodiment is described of a magnetic recording apparatus in which an ultrasonic actuator 5 with the structure described above is used for driving a magnetic recording head.

An actuator used for driving the magnetic recording head (hereinafter simply referred to as the head) of conventional magnetic recording apparatuses (hereinafter referred to as HDD) has a configuration in which an arm with the head installed thereon is supported in a rotatable manner by a pivot bearing, and the driving is being done by a VCM (voice coil motor). When driving the head of the HDD, it is necessary to carry out position control while following the fluctuation of the track on the disk rotating at high speed, and the actuator is required to have a very high speed of response and a high resolution. The improvement of response and resolution enables the recording density to be increased, thereby increasing the recording capacity of the HDD.

However, since the conventional actuator employs a bearing, it has a problem that when unwanted vibrations are excited due to the backlash of the bearing when the frequency of the swinging movement is increased, and the frequency of the swinging movement cannot be increased higher that that frequency. By using an ultrasonic actuator 5 according to the above-described preferred embodiments for the driving of the head of the HDD, it is possible to solve such problems.

Figure 6:
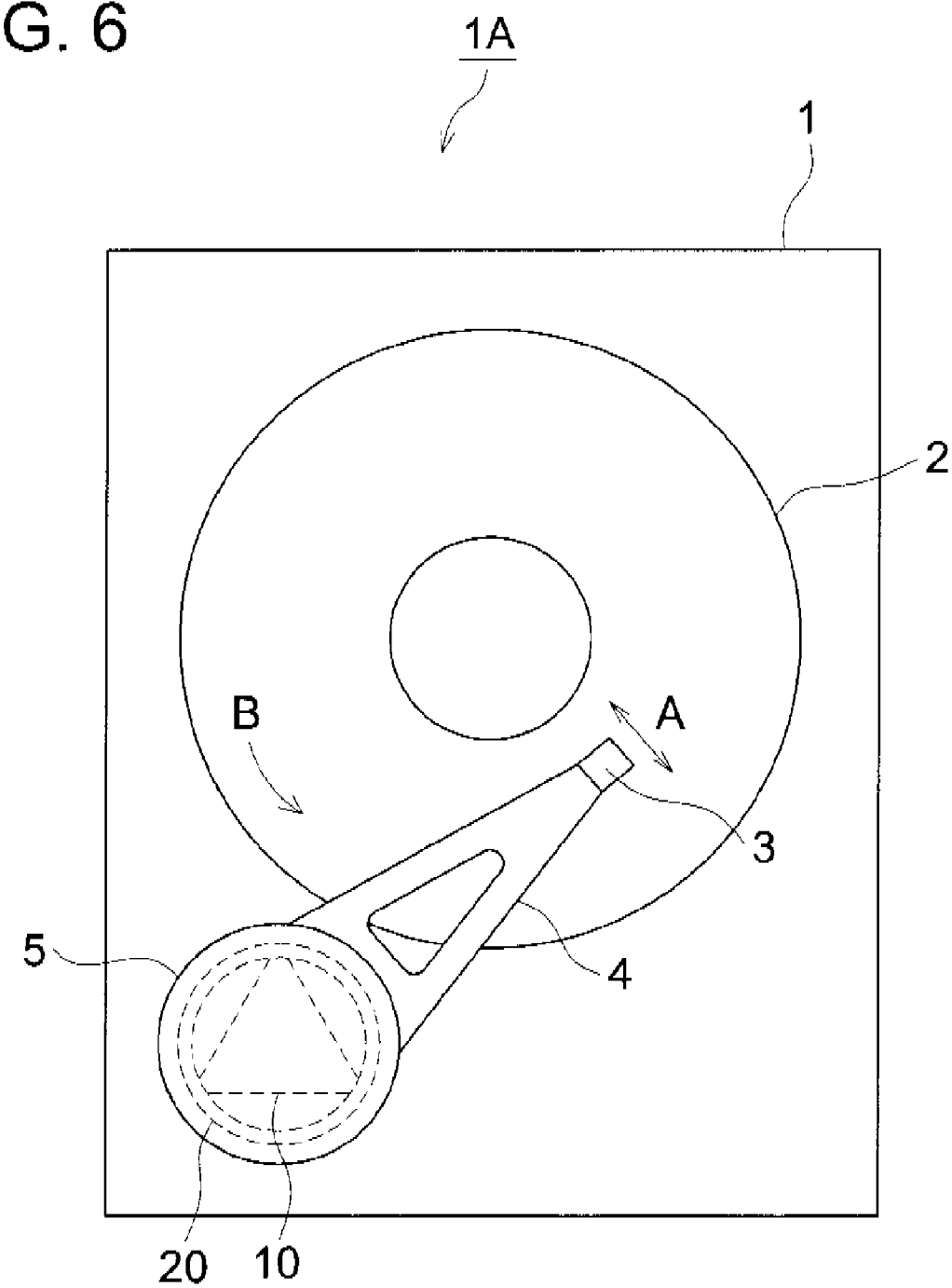
FIG. 6 is an overall configuration diagram showing the outline of a magnetic recording apparatus according to a preferred embodiment of the present invention.

FIG. 6 shows an outline configuration of an HDD 1A according to a preferred embodiment of the present invention. The HDD 1A is provided in its enclosure 1 with disks (recording medium) 2 for recording, an arm 4 that is provided so that it can rotate in the direction of the arrow A (the tracking direction) by an ultrasonic actuator 5, a magnetic head such as a head 3 provided at the tip of the arm 4, and a motor that is not shown in the figure but that can rotate the disk 2 in the direction of the arrow B, and the configuration is such that the head 3 can move relative to the disk 2.

The ultrasonic actuator 5, as explained earlier, has a configuration in which the rotor 20 can rotate without backlash while holding the vibrating member 10 by its elasticity, and also, the holding stability is extremely high because it is possible to hold the rotor 20 at the different vertices of the equilateral triangle of the vibrating member 10. Therefore, the resonant frequency of the ultrasonic actuator 5 can be higher, and a response speed much higher than a conventional device can be obtained.

Further, while the recording region on the disk 2 is about 30° in the drive angle of the arm 4, the fluctuation of the tracks is on the order of several nanometers to several tens of micrometers, which means that an extremely high accuracy and high response speed of positioning as well as a high speed driving over a wide range are demanded. In the ultrasonic actuator 5 according to the present preferred embodiment, by combining the rough movement by resonant drive and the fine movement by DC drive as described earlier, it is possible to meet these requirements, and in addition, since the configuration is extremely simple, it is possible to increase the productivity and also to reduce the production cost.

Second Preferred Embodiment

A vibrating member 10 according to a second preferred embodiment is shown in FIGS. 7a, 7b, 7c, and 7d. FIG. 7a is a front view showing the structure of the vibrating member 10, FIG. 7b is a side view diagram, FIG. 7c is a diagram showing the structure of the first internal electrode layer 101n1, and FIG. 7d is a diagram showing the structure of the second internal electrode layer 101n2.

The piezoelectric member 101 according to the first preferred embodiment is configured of a single piezoelectric ceramic as explained above, but in the case of the second preferred embodiment, it has a multilayer structure.

As shown in FIG. 7b, the piezoelectric member 101 has a piezoelectric ceramic thin plate (hereinafter referred to as a piezoelectric thin plate) 101h, the first internal electrodes 101n1a and 101n1b, and the second internal electrodes 101n2a and 101n2b are stacked alternately to make a multilayer structure. As shown in FIGS. 7c and 7d, the first internal electrodes 101n1a and 101n1b and the second internal electrodes 101n2a and 101n2b, similar to the driving electrodes in the case of the first preferred embodiment, have the shape of being divided (6 segments) by the perpendicular lines from each vertex of the vibrating member 10 to the side opposite to it.

On the side surface of the vibrating member 10 are provided, as shown in FIG. 7b, external electrodes 101g1a, 101g2a, 101g1b, and 101g2b, each of which are connected to each of the edges, projected from the side surface, of the internal electrodes 101n1a, 101n2a, 101n1b, and 101n2b, such that the internal electrodes are connected every other layer. In this case, the connection of the driving signal generator is made using lead wires to the external electrodes 101g1a, 101g2a, 101g1b, and 101g2b on the side surface.

Since the piezoelectric member 101 according to the second preferred embodiment has a multilayer structure, it is possible to obtain the same amplitude with a lower voltage compared to the case of the first preferred embodiment. Therefore, voltage multiplier circuits, etc., is unnecessary, the drive circuit is simplified, and is ideally applicable to battery driven equipment such as portable equipment. Further, the drive method is similar to the case of the first preferred embodiment.

Third Preferred Embodiment

A vibrating member 10 according to a third preferred embodiment is shown in FIGS. 8a, 8b, and 8c. FIG. 8a is a front view showing the structure of the vibrating member 10 according to the third preferred embodiment, FIG. 8b is a side view diagram, and FIG. 8c is a rear view diagram.

As shown in FIG. 8b, the vibrating member 10 according to the third preferred embodiment has a construction in which a thin plate shaped vibrating plate 101s has piezoelectric thin plates 101h adhered to it on its both sides.

The vibrating plate 101s is made of a metal. The piezoelectric thin plates 101h are adhered to the vibrating plate 101s using a conductive adhesive, and it is possible to use the vibrating plate 101s as a common electrode (the GND electrode). On the other surfaces of the piezoelectric thin plates 101h are formed driving electrodes (A-phase electrodes 101a and B-phase electrodes 101b) similar to the case of the first preferred embodiment. The FPC 30 (not shown) in the figure is connected to the driving electrodes on the two surfaces and to a fixing member 40 which is in electrical contact via the fixing pin 401 (not shown in the figure), which holds the vibrating member 10, with the vibrating plate 101s. In such a configuration, it is not necessary to additionally provide the chip members, and it is possible to use it as the chip member by using wear resistant material or surface treatment of the metallic vibrating plate 101s. As a material of the vibrating plate 101s, stainless steel with nitriding surface treatment which can be manufactured at a low cost is used, or a hard alloy, etc., is used.

In the case of the third preferred embodiment, by the resonant vibrations of the vibrating plate 101s due to the vibration applying force of the piezoelectric thin plate 101h, elliptical vibrations are generated in the different vertices of the vibrating member 10. Normally, since the Q value is higher in the case of a metal than piezoelectric ceramics, the energy loss during vibrations is small, and it is possible to suppress the heat generation of the vibrating member 10 and to increase the drive efficiency. Further, it is possible to construct this with an extremely small thickness, and since it is possible to make the volume of the piezoelectric member 101 relatively small, it is possible to reduce the cost, and hence it is suitable for application to portable equipment.

Fourth Preferred Embodiment

A vibrating member 10 according to a fourth preferred embodiment is shown in FIGS. 9a, 9b, 9c, and 9d. FIG. 9a is a front view diagram showing the structure of the vibrating member 10 according to the fourth preferred embodiment, FIG. 9b and FIG. 9d are the side view diagrams, and FIG. 9c is the bottom view diagram.

As shown in FIG. 9a, the vibrating member 10 according to the fourth preferred embodiment has a configuration in which piezoelectric thin plates 101h are adhered to each side of a metallic elastic member 105. The piezoelectric thin plate 101h of each side is divided into two segments, and driving electrodes (A-phase electrodes 101a and B-phase electrodes 101b) are provided on each of the vertices similar to the first preferred embodiment through the third preferred embodiment. The piezoelectric thin plates 101h being adhered to the metallic elastic member 105 with a conductive adhesive material, they are in electrical contact with the metallic elastic member 105, and it is possible to make the metallic elastic member 105 as the common electrode (the GND electrode). Further, in this case, the vibrating member 10 is provided with a through hole 10a at the position of its center of gravity, and is fixed to the fixing member 40 via a fixing pin 401 (both not shown in the figure).

AS a material of the metallic elastic member 105, any stainless steel with a surface hardening treatment such as nitriding surface treatment is used, or an ultra hard alloy is used similar to the case of the third preferred embodiment.

Similar to the case of the third preferred embodiment, an elliptical vibration is generated at each of the vertices of the vibrating member 10 due to the resonant vibration of the metallic elastic member 105 caused by the vibration applying force of the piezoelectric thin plates 101h.

Also in this case, since the energy loss is small during vibrations, it is not only possible to suppress heat generation but also to make the driving efficiency high.

Fifth Preferred Embodiment

A vibrating member 10 according to a fifth preferred embodiment is shown in FIGS. 10a, 10b, and 10c. FIG. 10a is a front view showing the structure of the vibrating member 10 according to the fifth preferred embodiment, FIG. 10b is a side view diagram, and FIG. 10c is a rear view diagram.

As shown in FIG. 10a, the vibrating member 10 according to the fifth preferred embodiment, is a modified example of the case of the first preferred embodiment, and is formed so that there is a depression in the neighborhood of the mid point of each of the sides of the vibrating member 10. By making the vibrating member 10 be in this shape, the bending vibration mode can be excited easily, and the amplitude of the vibrations in the tangential direction T described earlier can be made larger.

According to the preferred embodiments of the present invention, elliptical vibrations in the same rotational direction are generated in basically three vertices of the vibrating member, which is in pressure contact with the moving member, by resonant excitation in the expansion and contraction vibration mode and the bending vibration mode, and relative movement of the moving member with respect to the vibrating member is generated. In other words, since the moving member is made to carry out relative movement while being supported at the three vertices of an approximately equilateral triangular shaped vibrating member, the position of the moving member is stable, and it can be driven with a high accuracy. Further, since any point other than the three vertices of the vibrating member is not necessary to hold the moving member, drive loss is suppressed, and a high driving efficiency can be obtained. In addition, when the single-point characteristic mode is used, the resonant frequencies of the expansion and contraction vibration modes and the bending vibration mode are always identical, thus, the degree of freedom in designing the vibrating member is high, and since there is no difference between the resonant frequencies of the two modes during manufacture when manufactured, there is no reduction in the performance due to the frequency difference, thus, the vibrating member can be stably manufactured with very small fluctuations in performance. Because of this, an ultrasonic actuator which is stably equipped with a high driving performance is realized without complicating apparatuses of raising cost.

Further, by utilizing the ultrasonic actuators according to these preferred embodiments for driving the head of a magnetic recording apparatus, the accuracy of movement and the response speed of the head are improved, and the recording density of the magnetic recording apparatus can be increased.

What is claimed is:

1. An ultrasonic actuator, comprising:
   a vibrating member having a substantially triangular shape with three vertices; the vibrating member includes:
   three piezoelectric deformation portions each of which includes each of the vertices and deforms when a voltage is applied thereto;
   a moving member which is provided so as to be pressure contacted to the three vertices of the vibrating member, the moving member being caused to move relative to the vibrating member by elliptical motions of the three vertices caused by deformations of the piezoelectric deformation portions; and
   three pairs of A-phase electrodes and B-phase electrodes, each pair of the A-phase electrode and B-phase electrode being disposed on each of the three piezoelectric deformation portions, and either of the A-phase electrodes or the B-phase electrodes being selectively supplied with a driving voltage,
   wherein the three piezoelectric deformation portions have a same shape; wherein the vibrating member is configured to be driven in an expansion and contraction vibration mode in which the three vertices of the vibrating member radially and reciprocally move in phase due to expansion and contraction deformations of the three piezoelectric deformation portions, and in a bending vibration mode in which each of the three vertices of the vibrating member reciprocally moves in a direction substantially perpendicular to a direction of each of the expansion and contraction deformations; wherein two resonance frequencies of the vibrating member in the expansion and contraction vibration mode and the bending vibration mode are different from each other by a predetermined value; and wherein the expansion and contraction vibration mode and the bending vibration mode are simultaneously resonantly excited at a same frequency when the driving voltage containing an AC component of a frequency between the two resonance frequencies is selectively supplied to either of the A-phase electrodes and the B-phase electrodes, and thereby causing the three vertices of the vibrating member to elliptically vibrate in phase in a same rotational direction.

2. The ultrasonic actuator of claim 1, wherein the vibrating member has a substantially equilateral triangular shape.

3. The ultrasonic actuator of claim 1, wherein the moving member has a hollow cylindrical shape, rotates with respect to the vibrating member, and is pressure contacted to the three vertices of the vibrating member by an elastic force thereof such that an inner surface of the moving member is circumscribed about the vibrating member at the three vertices.

4. The ultrasonic actuator of claim 1, comprising:
   three support members each of which supports the vibrating member at a vicinity of a center of each of three sides of the vibrating member.

5. The ultrasonic actuator of claim 1, comprising:
   a support member which supports the vibrating member at a vicinity of a center of gravity of the vibrating member.

6. The ultrasonic actuator of claim 1, wherein the vibrating member includes:
a vibrating member body having a through hole disposed at a center of gravity of the vibration body.

7. The ultrasonic actuator of claim 1, comprising:
three contact members each of which is provided on each of the three vertices of the vibrating member and in contact with the moving member,
wherein a difference between two resonance frequencies of the vibrating member in the expansion and contraction vibration mode and the bending vibration mode is set to a predetermined value by adjusting mass of the contact member.

8. An ultrasonic actuator, comprising:
a vibrating member having a substantially triangular shape with three vertices; the vibrating member includes:
three piezoelectric deformation portions each of which includes each of the vertices and deforms when a voltage is applied thereto;
a moving member which is provided so as to be pressure contacted to the three vertices of the vibrating member, the moving member being caused to move relative to the vibrating member by elliptical motions of the three vertices caused by deformations of the piezoelectric deformation portions;
three pairs of A-phase electrodes and B-phase electrodes, each pair of the A-phase electrode and B-phase electrode being disposed on each of the three piezoelectric deformation portions, and either of the A-phase electrodes or the B-phase electrodes being selectively supplied with a driving voltage; and
a driving signal generator which generates the driving voltage,
wherein the three piezoelectric deformation portions have a same shape, the vibrating member is configured to be driven in an expansion and contraction vibration mode in which the three vertices of the vibrating member radially and reciprocally move in phase due to expansion and contraction deformations of the three piezoelectric deformation portions, and in a bending vibration mode in which each of the three vertices of the vibrating member reciprocally moves in a direction substantially perpendicular to a direction of each of the expansion and contraction deformations, the expansion and contraction vibration mode and the bending vibration mode are simultaneously resonantly excited at a same frequency so that the three vertices of the vibrating member elliptically vibrate in phase in a same rotational direction, and two resonance frequencies of the vibrating member in the expansion and contraction vibration mode and the bending vibration mode are different from each other by a predetermined value, the driving voltage contains an AC component of a frequency between the two resonance frequencies, and the driving signal generator selectively supplies the driving voltage to either of the A-phase electrodes and the B-phase electrodes.

9. A magnetic recording apparatus, comprising:
an ultrasonic actuator; the ultrasonic actuator including:
a vibrating member having a substantially triangular shape with three vertices;
the vibrating member includes:
three piezoelectric deformation portions each of which includes each of the vertices and deforms when a voltage is applied thereto;
a moving member which is provided so as to be pressure contacted to the three vertices of the vibrating member, the moving member being caused to move relative to the vibrating member by elliptical motions of the three vertices caused by deformations of the piezoelectric deformation portions;
three pairs of A-phase electrodes and B-phase electrodes, each pair of the A-phase electrode and B-phase electrode being disposed on each of the three piezoelectric deformation portions, and either of the A-phase electrodes or the B-phase electrodes being selectively supplied with a driving voltage, wherein the three piezoelectric deformation portions have a same shape; wherein the vibrating member is configured to be driven in an expansion and contraction vibration mode in which the three vertices of the vibrating member radially and reciprocally move in phase due to expansion and contraction deformations of the three piezoelectric deformation portions, and in a bending vibration mode in which each of the three vertices of the vibrating member reciprocally moves in a direction substantially perpendicular to a direction of each of the expansion and contraction deformations; wherein two resonance frequencies of the vibrating member in the expansion and contraction vibration mode and the bending vibration mode are different from each other by a predetermined value; and wherein the expansion and contraction vibration mode and the bending vibration mode are simultaneously resonantly excited at a same frequency when the driving voltage containing an AC component of a frequency between the two resonance frequencies is selectively supplied to either of the A-phase electrodes and the B-phase electrodes, and thereby causing the three vertices of the vibrating member to elliptically vibrate in phase in a same rotational direction;
a recording medium which records information thereon;
a magnetic head which reads and writes information from and in the recording medium; and
an arm which is fixedly secured to the moving member of the ultrasonic actuator and supports the magnetic head movably relative to the recording medium.

* * * * *

UNITED STATES PATENT AND TRADEMARK OFFICE
CERTIFICATE OF CORRECTION

PATENT NO. : 7,944,129 B2  
APPLICATION NO. : 12/169037  
DATED : May 17, 2011  
INVENTOR(S) : Takashi Matsuo Page 1 of 1

It is certified that error appears in the above-identified patent and that said Letters Patent is hereby corrected as shown below:

On the Title page:
Item (75) Inventor:, delete "Takeshi Matsuo, Itami (JP)" and
insert -- Takashi Matsuo, Itami (JP) --.

Signed and Sealed this
Twelfth Day of July, 2011

David J. Kappos
*Director of the United States Patent and Trademark Office*